United States Patent
Takano (10) Patent No.: US 6,889,014 B2
(45) Date of Patent: May 3, 2005

(54) EXPOSURE SYSTEM, DEVICE PRODUCTION METHOD, SEMICONDUCTOR PRODUCTION FACTORY, AND EXPOSURE APPARATUS MAINTENANCE METHOD

(75) Inventor: Shin Takano, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 270 days.

(21) Appl. No.: 10/187,282

(22) Filed: Jul. 2, 2002

(65) Prior Publication Data

US 2003/0013213 A1 Jan. 16, 2003

(30) Foreign Application Priority Data

Jul. 10, 2001 (JP) ........................................ 2001-208958

(51) Int. Cl.$^7$ ............................................. G03G 15/00
(52) U.S. Cl. ........................................................ 399/49
(58) Field of Search ........................ 382/149; 324/765; 355/53, 27; 399/49; 430/30; 250/548; 798/719

(56) References Cited

U.S. PATENT DOCUMENTS

| | | | | |
|---|---|---|---|---|
| 5,424,552 A | * | 6/1995 | Tsuji | 250/548 |
| 5,965,308 A | * | 10/1999 | Ozawa | 430/30 |
| 6,331,885 B1 | * | 12/2001 | Nishi | 355/53 |
| 6,404,911 B2 | * | 6/2002 | Ishihara | 382/149 |
| 6,418,281 B1 | * | 7/2002 | Ohki | 399/49 |
| 6,459,292 B1 | * | 10/2002 | Oikawa | 324/765 |
| 6,466,300 B1 | * | 10/2002 | Deguchi | 355/27 |
| 6,493,065 B2 | * | 12/2002 | Ina | 355/53 |

* cited by examiner

*Primary Examiner*—John F. Niebling
*Assistant Examiner*—Andre' Stevenson
(74) *Attorney, Agent, or Firm*—Fitzpatrick, Cella, Harper & Scinto (57) ABSTRACT

An exposure system includes a wafer processing apparatus for performing a preparation-for-exposure process on a wafer before an exposure process is performed, an exposure apparatus for performing the exposure process on the wafer subjected to the preparation-for-exposure process performed by the wafer processing apparatus, wherein the exposure apparatus also performs a calibration process to correct an error caused by a time-varying environmental parameter and/or caused by the exposure apparatus itself, and a host computer connected to the wafer processing apparatus and the exposure apparatus via communication means. Depending on the time needed for the wafer processing apparatus to perform the preparation-for-exposure process, the host computer outputs a calibration execution command for performing the calibration process to the exposure apparatus. Thereby, the total time from the start of processing a lot to the end thereof is minimized and thus, the total throughput is improved.

13 Claims, 10 Drawing Sheets

$T_{MOVE1}$ : PROCESSING PATH (FORWARD)
PRODUCTION LINE 1-a
1 : A1→R1→B1 (CT) →C1 (HP) →B3 (cold) →R2→D1 = 60 SEC
2 : A2→R1→B2 (CT) →C1 (HP) →B3 (cold) →R2→D1 = 70 SEC
3 : A3→R1→B1 (CT) →C2 (HP) →B3 (cold) →R2→D1 = 60 SEC
⋮
PRODUCTION LINE 1-b
1 : A4→R1→B1 (CT) →C1 (HP) →B3 (cold) →R2→D1 = 80 SEC
2 : A1→R1→B2 (CT) →C2 (HP) →B3 (cold) →R2→D1 = 85 SEC
3 : A2→R1→B2 (CT) →C1 (HP) →B3 (cold) →R2→D1 = 55 SEC
⋮

$T_{MOVE2}$ : PROCESSING PATH (REVERSE)
PRODUCTION LINE 1-a
1 : D2→R2→C3 (DEV) →R1→A1 = 95 SEC
⋮
PRODUCTION LINE 1-b
1 : D2→R2→C3 (DEV) →R1→A2 = 80 SEC
⋮

$T_{COOL}$ : OPTIMUM COOLING TIME
PRODUCTION LINE 1-a
1 : 100℃→23℃ = 70 SEC
2 : 95℃→23℃ = 65 SEC
3 : 90℃→23℃ = 55 SEC
⋮
PRODUCTION LINE 1-b
1 : 85℃→23℃ = 65 SEC
2 : 80℃→23℃ = 45 SEC
⋮

$T_{PRINT}$ : PROCESS-1 (RESIST COATING)
PRODUCTION LINE 1-a
1 : 10 SEC
⋮
PRODUCTION LINE 1-b
1 : 15 SEC
⋮

$T_{HOT}$ : PROCESS-2 (HEAT TREATMENT TO SOLIDIFY THE RESIST)
PRODUCTION LINE 1-a
1 : 100℃ = 30 SEC
2 : 90℃ = 35 SEC
⋮
PRODUCTION LINE 1-b
1 : 80℃ = 40 SEC
2 : 70℃ = 50 SEC
⋮

$T_{DEVE}$ : PROCESS-3 (RESIST DEVELOPMENT AND REMOVAL)
PRODUCTION LINE 1-a
1 : 60 SEC
⋮
PRODUCTION LINE 1-b
1 : 50 SEC
⋮

FIG. 4

$T_{JOB}$ : READING OF JOB FILE
    1 : 10 SEC $T_{RETICLE}$ : RETICLE SETTING
    1 : 20 SEC $T_{MAINT-B}$ : BASELINE MEASUREMENT
    1-a : 20 SEC
    1-b : 35 SEC
    1-c : 25 SEC $T_{MAINT-F}$ : FOCUS CALIBRATION
    1-a : 15 SEC
    1-b : 30 SEC
    1-c : 20 SEC $T_{MAINT-S}$ : STAGE REFERENCE POINT CALIBRATION
    1-a : 15 SEC
    1-b : 30 SEC
    1-c : 20 SEC

```
URL  http://www.maintain.co.jp/db/input.html

TROUBLE DB

DATE OF OCCURRENCE  [2000/3/15]  ~404
APPARATUS TYPE  [**********]  ~401
TITLE  [OPERATION FAILURE (AT THE START)]  ~403
SERIAL NUMBER OF APPARATUS  [465NS4580001]  ~402
DEGREE OF URGENCY  [D]  ~405

SYMPTOM    WHEN THE POWER OF THE APPARATUS
           WAS TURNED ON, THE LED BLINKED AND    ~406
           THE BLINKING DID NOT STOP

TREATMENT  THE APPARATUS WAS RESTARTED
           (BY PRESSING THE RED BUTTON OF        ~407
            TEH POWER SWITCH)

CURRENT    TEMPORARY TREATMENT HAS BEEN
STATUS     PERFORMED                             ~408

[SEND] [RESET]     410              411              412
              LINK TO THE LIST OF RESULTS  SOFTWARE LIBRARY  OPERATION GUIDE
```

EXPOSURE SYSTEM, DEVICE PRODUCTION METHOD, SEMICONDUCTOR PRODUCTION FACTORY, AND EXPOSURE APPARATUS MAINTENANCE METHOD

BACKGROUND OF THE INVENTION

1. Field of the Invention

The present invention relates to an exposure system used to produce a semiconductor device such as an integrated circuit, a device production method, a semiconductor production factory, and an exposure apparatus maintenance method, and more particularly, to an online-controlled production system used in a production line including a set of semiconductor production apparatuses including an exposure apparatus, a resist coater, and a developing apparatus which are connected to a host computer for controlling these apparatuses in a centralized manner.

2. Description of the Related Art

In a processing flow using a conventional exposure system including a combination of an exposure apparatus and a wafer processing apparatus (e.g., a resist coater and a developing apparatus), a preparation-for-exposure process (such as resist coating and pre-baking) is first performed by the wafer processing apparatus, in preparation for exposure of a wafer, and then, the wafer is exposed by the exposure apparatus. At the beginning of a lot or at a transition between lots, the exposure apparatus waits for a wafer without performing any processing until the wafer processing apparatus completes the preparation-for-exposure process.

It is required to periodically perform a maintenance process on the exposure apparatus to correct errors of various units thereof. The maintenance process is usually performed immediately before the exposure process.

In recent years, in many cases, the production line must be flexible to produce small numbers of various types of devices, and thus, the exposure system must have high productivity when used in such a production line.

The maintenance process includes a calibration process of various items such as baseline calibration and focus calibration. The calibration process must be performed for every fixed number of wafers (or in fixed intervals) to correct errors caused by time-varying environmental parameters (e.g., atmospheric pressure, temperature, etc.) or caused by the exposure apparatus itself. To minimize the time-varying factors, it is desirable to perform the calibration immediately before the exposure process for a lot (i.e., at the start of a job).

In actual factories, at present, when a plurality of lots are successively produced, the exposure apparatus waits for a wafer without performing any processing when the wafer processing apparatus performs a process for transition to another lot after completing one lot or when the wafer processing apparatus performs the preparation-for-exposure process. The maintenance process is performed after a wafer, subjected to the preparation-for-exposure process performed by the wafer processing apparatus, is fed into the exposure apparatus. This causes a reduction in the operation efficiency, which can cause an undesirable problem, in particular, when small numbers of various types of devices are produced. Furthermore, the time for the maintenance process including the calibration process causes a throughput reduction which cannot be ignored.

To meet the needs for production of small numbers of various types of devices, the production line is expected to have to more frequently perform processing for a lot including only one wafer. Thus, a requirement is to improve the operation efficiency and the total throughput.

SUMMARY OF THE INVENTION

In view of the above, it is an object of the present invention to provide a technique of optimizing the timing of the maintenance process so as to improve the operation efficiency of an exposure apparatus, thereby improving the total throughput.

According to an aspect of the present invention, to achieve the above object, there is provided an exposure system comprising a wafer processing apparatus for performing a preparation-for-exposure process on a wafer before an exposure process is performed; an exposure apparatus for performing the exposure process on the wafer subjected to the preparation-for-exposure process performed by the wafer processing apparatus, wherein the exposure apparatus also performs a calibration process to correct an error caused by at least one of (i) a time-varying environmental parameter and (ii) the exposure apparatus itself; and a host computer connected to the wafer processing apparatus and the exposure apparatus via communication means, wherein, depending on the time needed for the wafer processing apparatus to perform the preparation-for-exposure process, the host computer outputs to the exposure apparatus a calibration execution command for performing the calibration process.

In this exposure system, the host computer may determine whether the exposure apparatus can perform the complete calibration process before the exposure apparatus receives a wafer subjected to the preparation-for-exposure process by the wafer processing apparatus, and the host computer may output the calibration execution command depending on the result of the determination.

The time needed for the wafer processing apparatus to perform the preparation-for-exposure process and the time needed for the exposure apparatus to perform the calibration process may be actually measured in advance and stored.

The calibration process may be performed at a time at which a wafer to be first exposed is supplied to the exposure apparatus, when the exposure system is started or when a plurality of lots are successively processed.

The calibration process may include at least one of a baseline calibration process, a focus calibration process, and a stage reference point calibration process.

The exposure apparatus may include a plurality of wafer processing apparatuses and a plurality of exposure apparatuses, which are all connected to the host computer.

The wafer processing apparatus may include a coater for coating a resist on a wafer, a cold plate for cooling a wafer, a hot plate for heating a wafer, and a wafer hand for transferring a wafer.

The wafer processing apparatus may further include a developing apparatus for selectively removing a resist from a wafer subjected to the exposure process performed by the exposure apparatus.

If the host computer determines that the exposure apparatus cannot complete all items of the calibration process by a time at which a wafer subjected to the preparation-for-exposure process performed by the wafer processing apparatus is supplied, the host computer may select one or more items of the calibration process and may output a command to execute the selected items.

According to another aspect of the present invention, there is provided a device production method comprising the steps of providing, in a semiconductor production factory, a set of production apparatuses for performing processes, the set including an exposure apparatus and a wafer processing apparatus performing, by the wafer processing apparatus, a preparation-for-exposure process on a wafer before performing an exposure process, performing, by the exposure apparatus, (i) the exposure process on the wafer subjected to the preparation-for-exposure process performed by the wafer processing apparatus, and (ii) a calibration process to correct an error caused by a time-varying environmental parameter or caused by the apparatus itself, and communicating the set of production apparatuses with a host computer via communication means, wherein when a semiconductor device is produced by performing a plurality of processes using the set of the production apparatuses, the host computer controls the timing of the calibration process, taking into account an amount of time to perform processes by the exposure apparatus and an amount of time to perform processes by the wafer processing apparatus. The communication means connected between the host computer and the set of the production apparatuses may be a local area network installed in the semiconductor production factory, and the method may further comprise transmitting data representing information associated with at least one of apparatuses of the set of the production apparatuses between the local area network and an external network outside the semiconductor production factory. The semiconductor production method may further comprise the step of acquiring maintenance information of a production apparatus by performing data communication by accessing via the external network a database provided by a vendor or a user of the production apparatus, or the step of managing production by performing data communication via the external network between the semiconductor production factory and another, different, semiconductor production factory.

According to still another aspect of the present invention, there is provided a semiconductor production factory comprising a set of production apparatuses for performing processes, the set including an exposure apparatus and a wafer processing apparatus the wafer processing apparatus being provided for performing a preparation-for-exposure process on a wafer before performing an exposure process, and the exposure apparatus being provided for performing the exposure process on the wafer subjected to the preparation-for-exposure process by the wafer processing apparatus, wherein the exposure apparatus also performs a calibration process to correct an error caused by a time-varying environmental parameter or caused by the exposure apparatus itself; a local area network for communicating the set of production apparatuses with a host computer wherein, depending on the time needed for the wafer process apparatus to perform the preparation-for-exposure process, the host computer outputs to the exposure apparatus a calibration execution command for performing the calibration process; and a gateway for making it possible to access an external network outside the factory from the local area network, so that information of at least one apparatus included in the set of apparatuses can be transmitted by means of data communication.

According to still another aspect of the present invention, there is provided a method of maintaining an exposure apparatus for performing an exposure process on a wafer subjected to a preparation-for-exposure process performed by a wafer processing apparatus, wherein the exposure process also performs a calibration process to correct an error caused by at least one of (i) a time-varying environmental parameter and (ii) the exposure apparatus itself, the exposure apparatus being installed in a semiconductor production factory, the method comprising the steps of providing, by a vendor or a user of the exposure apparatus, a maintenance database connected to an external network of the semiconductor production factory; enabling the semiconductor production factory to access the maintenance database via the external network; and transmitting maintenance information stored in the maintenance database to the semiconductor production factory via the external network.

The exposure apparatus in the exposure system may include a display, a network interface, and a computer for executing network driver software, thereby establishing a computer network and allowing maintenance information of the exposure apparatus to be transmitted by means of data communication via the computer network.

The network driver software may provide on the display a user interface for accessing the maintenance database, which is provided by a vendor or a user of the exposure apparatus and which is connected to an external network of a factory in which the exposure apparatus is installed, thereby making it possible to acquire information from the database via the external network.

In the present invention, as described above, the time is calculated which is needed to perform the preparation-for-exposure process by the wafer processing apparatus and to feed a first wafer to the exposure apparatus after starting processing for a lot (the time is equal to the sum of processing times needed for resist coating, prebaking, etc.), and the calculated time is compared with the time needed for the preparation-for-exposure process (including the maintenance time) performed by the exposure apparatus to determine whether the exposure apparatus has a waiting time. If the exposure apparatus is determined to have a waiting time, the maintenance process (calibration process for correction of time-varying errors) is performed within the waiting time, thereby making it possible for the exposure apparatus to efficiently operate during the time in which the wafer processing apparatus transfers a wafer or during the time in which the preparation-for-exposure process is performed.

Further objects, features and advantages of the present invention will become apparent from the following description of the preferred embodiments with reference to the attached drawings.

DESCRIPTION OF THE PREFERRED EMBODIMENTS

The present invention is described in detail below with reference to preferred embodiments in conjunction with the accompanying drawings.

Embodiment of Exposure System

Figure 1:
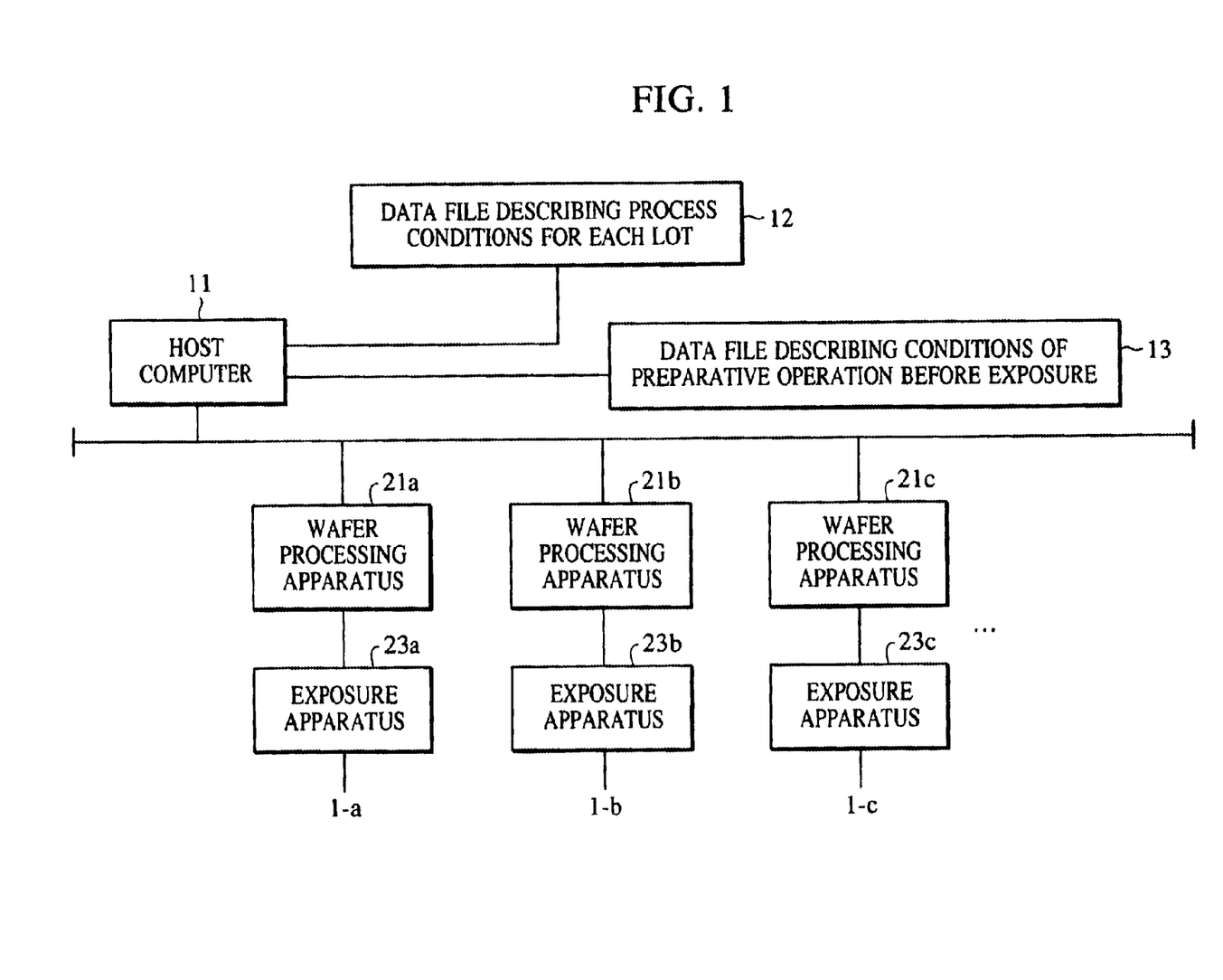
FIG. 1 is a diagram illustrating an exposure system according to an embodiment of the present invention.

FIG. 1 illustrates the general construction of an exposure system according to an embodiment of the present invention. In FIG. 1, reference numeral 11 denotes a host computer that manages, in a concentrated fashion, data needed in production management of the exposure system and issues a maintenance command to respective exposure apparatuses. Reference numeral 12 denotes a lot processing condition data file in which data indicating times needed for various processes performed by the wafer processing apparatus is described for each lot. Reference numeral 13 denotes a preparation-for-exposure processing data file in which experimentally determined data indicating times needed for various processes performed by the exposure apparatus of each production line is described. Reference numerals 1-$a$, 1-$b$, and 1-$c$ denote production lines which operate under the control of the host computer 11. Each of the production lines 1-$a$, 1-$b$, and 1-$c$ includes a wafer processing apparatus 21$a$, 21$b$, or 21$c$, and an exposure apparatus 23$a$, 23$b$, or 23$c$.

Figure 2:
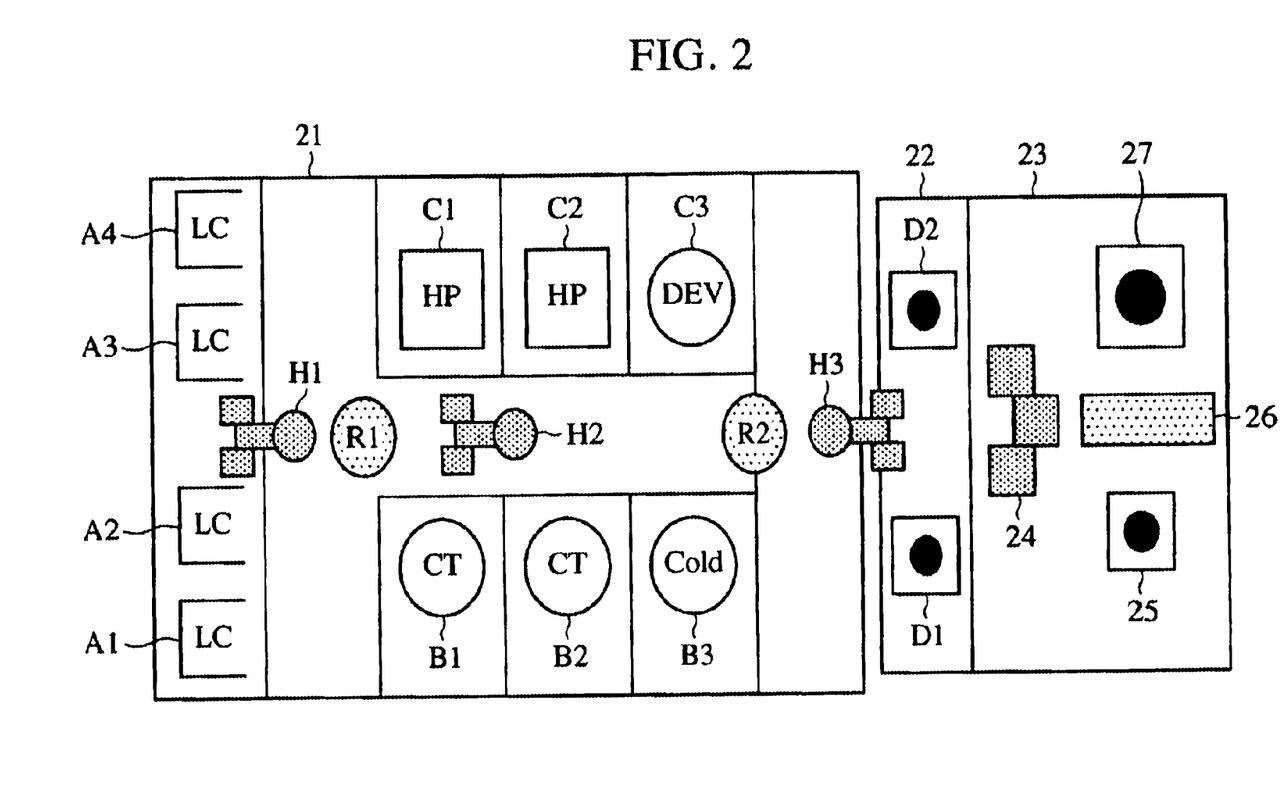
FIG. 2 is a diagram illustrating a wafer processing apparatus and an exposure apparatus according to an embodiment of the present invention.

FIG. 2 illustrates a wafer processing apparatus and an exposure apparatus used in the present embodiment. In FIG. 2, reference numeral 21 denotes the wafer processing apparatus; 22 denotes an inline transfer unit for transferring a wafer between the wafer processing apparatus 21 and an exposure apparatus 23; 23 denotes the exposure apparatus for performing an exposure process on a wafer; 24 denotes a transfer hand for transferring a wafer to a carrier or the inline transfer unit 22; 25 denotes a mechanical pre-alignment unit for mechanically pre-aligning a wafer; 26 denotes a feed hand for feeding a mechanically pre-aligned wafer to a wafer stage; 27 denotes the wafer stage for moving a wafer to an exposure position; R1 and R2 denote intermediate storage carriers for storing a wafer; H1, H2, and H3 denote wafer hands for transferring a wafer from the wafer processing apparatus 21 to the exposure apparatus 23; A1, A2, A3, and A4 denote lot carriers; B1 and B2 denote coater cups for coating a resist on a wafer; B3 denotes a cold plate for adjusting the temperature of a wafer; C1 and C2 denote hot plates for heating a wafer coated with a resist at a specified temperature to solidify the resist; C3 denotes a developer cup for selectively removing an exposed resist on a wafer; D1 denotes an inline feed-in station for transferring a wafer subjected to the preparation-for-exposure process to the exposure apparatus 23 to perform exposure processing; and D2 denotes an inline feed-out station for transferring a wafer subjected to exposure processing from the exposure apparatus 23 to the wafer processing apparatus 21 via the inline transfer unit 22 to perform next processing.

Figure 3:
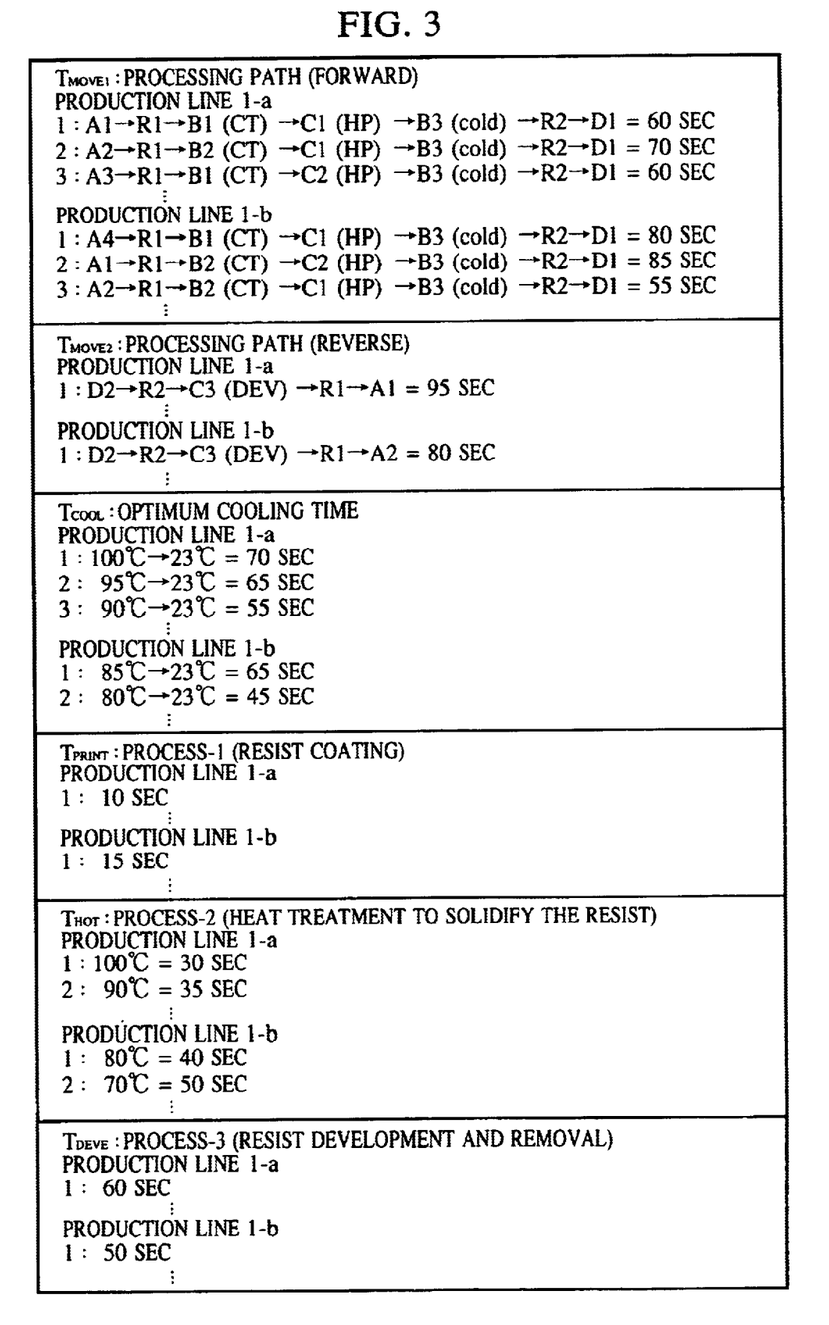
FIG. 3 is a diagram illustrating an example of a format of a lot processing condition data file in which data indicating times of processes performed by the wafer processing apparatus are described for each lot.

FIG. 3 shows a specific example of lot processing condition data described in the lot processing condition data file shown in FIG. 1. In this file, experimentally determined data indicating times needed for various processes performed by the wafer processing apparatus 21 is described for each lot. In the specific example shown in FIG. 3, numerals described at the left end (1, 2, and so on) represent the lot numbers.

In FIG. 3, in a data field of "$T_{MOVE1}$: PROCESSING PATH (FORWARD)", there is registered data indicating the time needed for each wafer to move, in the production line 1-$a$ or 1-$b$, from one of lot carriers A1 to A4 of the corresponding wafer processing apparatus 21 to the inline feed-in station D1 via various processing apparatuses. This time indicates only the wafer movement time calculated on the basis of experimental data and does not include processing times of various processing steps.

In a data field of "$T_{MOVE2}$: PROCESSING PATH (REVERSE)", there is registered data indicating the time needed for an exposed wafer to move, in the production line 1-$a$ or 1-$b$, from the inline feed-out station D2 to one of the lot carriers A1 to A4 via various processing apparatuses. This time indicates only the wafer movement time calculated on the basis of experimental data and does not include processing times of various processing steps.

In a data field of "$T_{COOL}$: OPTIMUM COOLING TIME", there is registered data indicating the time needed to cool a wafer by the cold plate B3 to a temperature optimum for exposure from a temperature to which the wafer has been heated for solidification by the hot plate C1 or C2 in the production line 1-$a$ or 1-$b$, wherein the time is experimentally determined for each lot.

In a data field of "$T_{PRINT}$: PROCESS-1 (RESIST COATING)", there is registered data indicating the time needed to coat a resist by the coater cup B1 or B2 in the production line 1-$a$ or 1-$b$.

In a data field of "$T_{HOT}$: PROCESS-2 (HEAT TREATMENT TO SOLIDIFY THE RESIST)", there is registered data indicating the time needed to bake a wafer to solidify the resist by the hot plate C1 or C2 in the production line 1-$a$ or 1-$b$.

In a data field of "$T_{DEVE}$: PROCESS-3 (RESIST DEVELOPMENT)", there is registered data indicating the time needed to develop a resist on a wafer exposed by the developer cup C3 in the production line 1-$a$ or 1-$b$.

Figure 4:
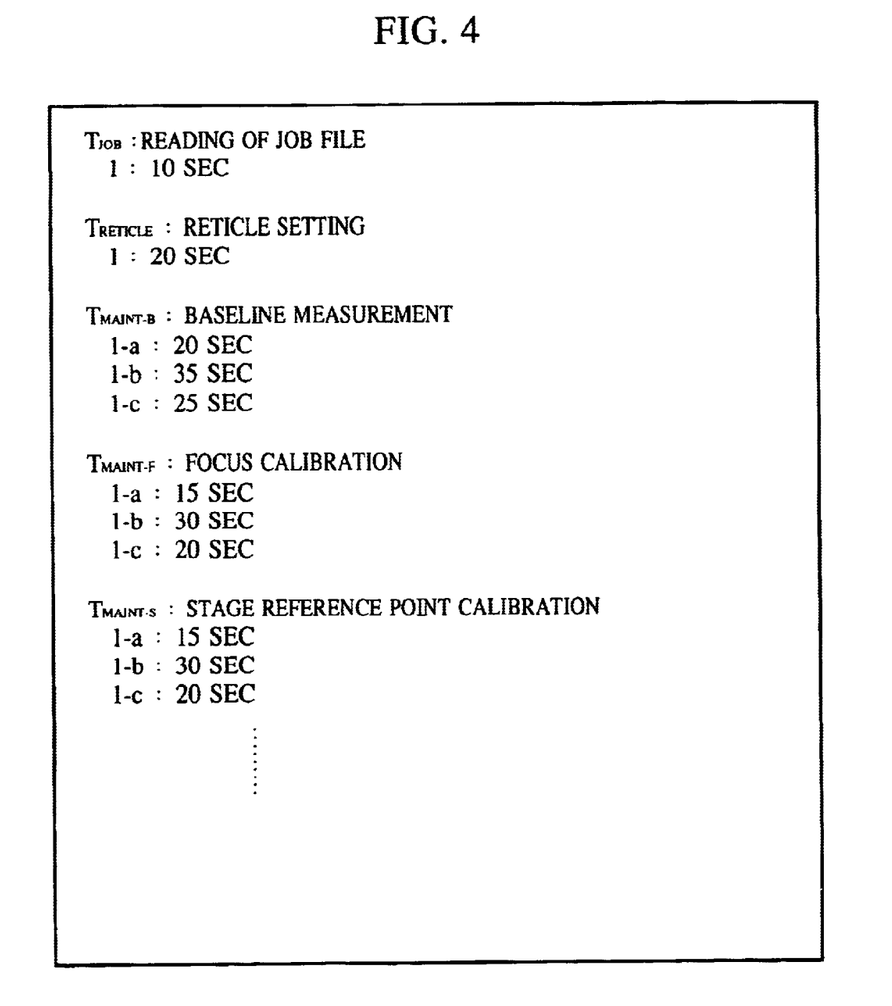
FIG. 4 is a diagram illustrating an example of a format of a preparation-for-exposure processing data file in which data indicating times of processes performed by the exposure apparatus of each production line are described.

FIG. 4 shows a specific example of processing time data which is set for the exposure apparatus 23 in each production line and stored in the preparation-for-exposure processing data file shown in FIG. 1. In this file, experimentally determined data indicating times needed for various processes performed by the exposure apparatus 23 of each production line is described.

In FIG. 4, in a data field of "$T_{JOB}$: READING OF JOB FILE", there is registered data indicating the time needed for the exposure apparatus 23 to read a job file and check whether exposure conditions are satisfied. In a data field of "$T_{RETICLE}$: RETICLE SETTING", there is registered data indicating the time needed for the exposure apparatus 23 to load a reticle specified in the job file onto a reticle stage. In a data field of "$T_{MAINT-B}$: BASELINE MEASUREMENT", there is registered data indicating the time needed for each exposure apparatus 23 in the production lines 1-$a$ to 1-$c$ to perform the baseline measurement. In a data field of "$T_{MAINT-F}$: FOCUS CALIBRATION", there is registered data indicating the time needed for each exposure apparatus 23 in the production lines 1-$a$ to 1-$c$ to perform the focus calibration. In a data field of "$T_{MAINT-S}$: STAGE REFERENCE POINT CALIBRATION", there is registered data indicating the time needed for each exposure apparatus 23 in the production lines 1-$a$ to 1-$c$ to perform the stage reference point calibration.

Figure 5:
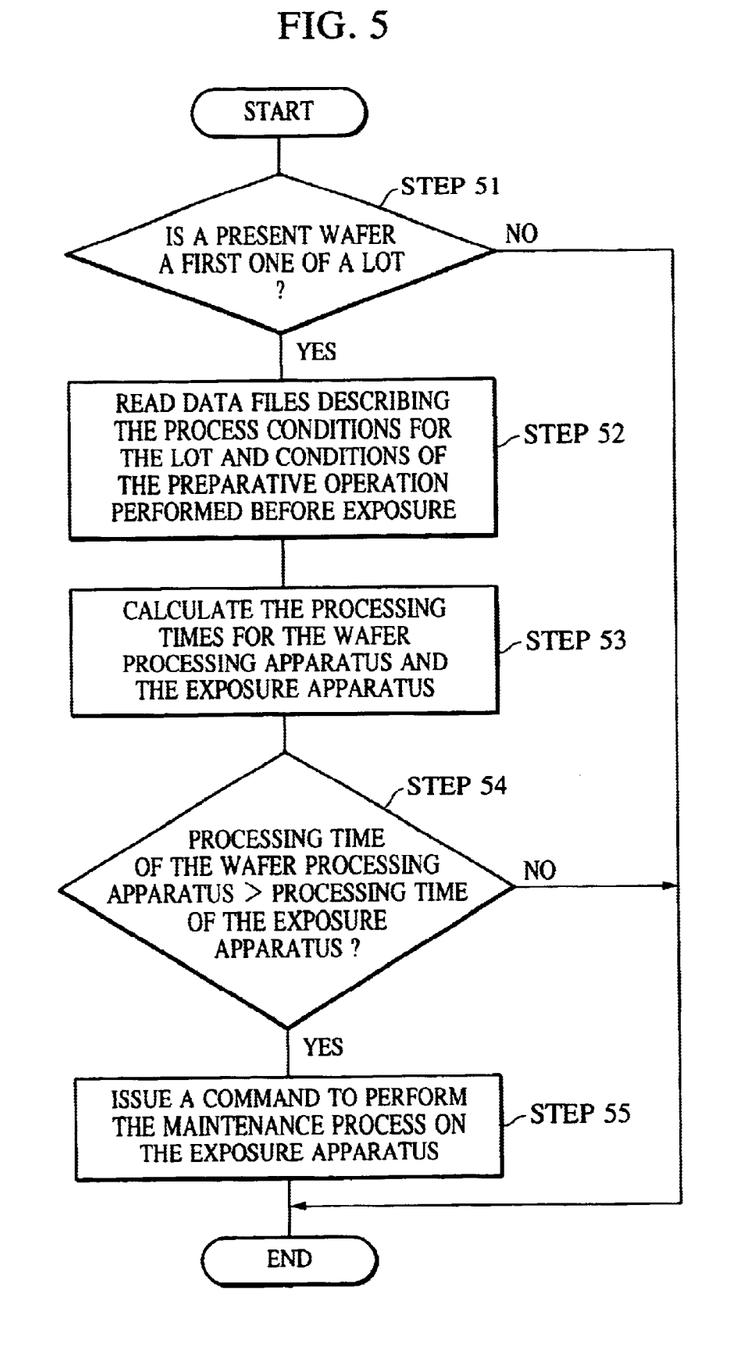
FIG. 5 is a flow chart of a control process according to the present invention.

FIG. 5 shows a flow chart illustrating a control process performed, in the exposure system according to the present embodiment, to determine whether the exposure apparatus 23 should perform the maintenance process before exposing a next wafer of a current lot.

First, the host computer 11 determines whether a wafer which is going to be processed is a first wafer of a lot (step 51). If the wafer is not a first one of a lot, the control process is terminated. If the wafer is determined to be a first one of a lot (step 51), the host computer 11 reads the lot processing condition data file and the preparation-for-exposure processing data file (step 52) and calculates the processing times of the wafer processing apparatus and the exposure apparatus, respectively (step 53). The host computer 11 compares the calculated processing times with each other (step 54). If the processing time of the exposure apparatus is determined to be longer than that of the wafer processing apparatus, the control process is terminated. However, if it is determined in step 55 that the processing time of the wafer processing apparatus is longer, the host computer 11 sends a maintenance execution command to the exposure apparatus (step 56).

The control of a first wafer of a lot is described in further detail below. The host computer 11 reads data from a lot processing condition data file 12 and a preparation-for-exposure processing data file 13 corresponding to a production line which is going to start production. The host computer 11 calculates the operation times of the respective apparatuses and determines whether the maintenance processing of the exposure apparatus 23 should be performed in advance. If it is determined that the maintenance processing can be executed, the maintenance processing of the exposure apparatus 30 is executed, thereby allowing an improvement in the total throughput.

In the lot processing condition data file 12, there is described data indicating:

$T_{MOVE1}$: wafer feed-in time (the time needed to transfer a wafer from the wafer processing apparatus to the inline feed-in station);

$T_{MOVE2}$: feed-out time of an exposed wafer (the time needed to transfer a wafer from the inline feed-out station to a lot carrier in the wafer processing apparatus);

$T_{COOL}$: optimum cooling time after prebaking;

$T_{PRINT}$: time needed to coat a resist; and $T_{HOT}$: time needed for prebaking (for resist solidification).

The maintenance processing time of the exposure apparatus 23 is generally shorter than the sum of the processing times $T_{MOVE1}$, $T_{MOVE2}$, $T_{COOL}$, $T_{PRINT}$ and $T_{HOT}$, and thus the maintenance processing of the exposure apparatus 23 is performed depending on the status of the wafer processing apparatus 21 in a transition period from one lot to another lot.

From the data described in the lot processing condition data file 12 and the preparation-for-exposure processing data file 13, the host computer 11 calculates the times needed for transferring a wafer through the respective paths in the production line and the time needed for the maintenance process.

More specifically, for the production line 1-$a$ shown in FIG. 1, for example, the wafer supply time $T_{SUPPLY}$ needed to supply a wafer from the wafer processing apparatus 21$a$ to the exposure apparatus 23$a$ is determined by reading, from the lot processing condition data file 12, the time $T_{MOVE1}$ (No. 1) (=60 sec) needed to feed a wafer from the wafer processing apparatus 21$a$ to the inline feed-in station D1, the resist coating time $T_{PRINT}$ (No. 1) (=10 sec), the prebaking time $T_{HOT}$ (No. 1) (=30 sec), and the optimum cooling time $T_{COOL}$ (No. 1) (=70 sec) after the prebaking, and calculating the sum of these values (the sum is determined to be 170 sec, in this specific case). That is, $T_{SUPPLY}$ is given by equation (1) shown below.

$$T_{SUPPLY} = T_{MOVE1} + T_{PRINT} + T_{HOT} + T_{COOL} \quad (1)$$

Similarly, the time needed for the preparation-for-exposure process $T_{EXPO\_PRE}$ for the production line 1-$a$ is determined by reading, from the preparation-for-exposure processing data file 13, the reticle setting time $T_{RETICLE}$ (=20 sec), the time $T_{JOB}$ (=10 sec) needed to read a job file, and the maintenance processing times of the exposure apparatus 23$a$ $T_{MAINT-B}$ (=20 sec), $T_{MAINT-F}$ (=15 sec), and $T_{MAINT-S}$ (=15 sec) and calculating the sum of these values (the sum is determined to be 80 sec, in this specific example). That is, the time needed for the preparation-for-exposure process $T_{EXPO\_PRE}$ is given by equation (2) shown below.

$$T_{EXPO\_PRE} = T_{RETICLE} + T_{JOB} + T_{MAINT-B} + T_{MAINT-F} + T_{MAINT-S} \quad (2)$$

Thereafter, the wafer supply time $T_{SUPPLY}$ and the time needed for the preparation-for-exposure process $T_{EXPO\_PRE}$ are compared with each other. If the wafer supply time is longer than the time needed for the preparation-for-exposure process (as is the case of this specific example in which $T_{SUPPLY}$ (=170 sec)>$T_{EXPO\_PRE}$ (80 sec)), the host computer 11 issues a command to the exposure apparatus 23$a$ of the production line 1-$a$ to execute the maintenance process within a lot transition period. That is, the command is issued when the following condition is satisfied.

wafer supply time $T_{SUPPLY}$>time needed for the preparation-for-exposure process $T_{EXPO\_PRE}$ (3)

However, in a case in which the time needed for the preparation-for-exposure process is longer than the wafer supply time, i.e., in a case in which the condition (4) shown below is satisfied, the host computer 11 selects one or more maintenance items from $T_{MAINT-B}$, $T_{MAINT-F}$, and $T_{MAINT-S}$ such that the total time of the selected maintenance items satisfies the condition (3) and the host computer 11 issues a command to the exposure apparatus 23$a$ of the production line 1-$a$ to execute the selected maintenance items during the lot transition period.

wafer supply time $T_{SUPPLY}$<time needed for the preparation-for-exposure process $T_{EXPO\_PRE}$ (4)

In the exposure system according to the present embodiment in which, as described above, a plurality of semiconductor device production lines 1$a$ to 1$c$ including exposure apparatuses 23$a$ to 23$c$, resist coaters, and developing apparatuses are connected to the host computer 11 via communication means (network) so that the host computer 11 can control these semiconductor production apparatuses on-line in an centralized manner. The host computer 11 calculates the time needed to supply a first wafer of a lot to the exposure apparatus 23 after starting the apparatuses or the lot switching time needed to supply a first wafer of a next lot to each exposure apparatus 23 after completing a post-process on a last exposed wafer of a previous lot (i.e., the time equal to the sum of the time needed to coat a resist on a wafer, the time needed for development, and so on), and the host computer 11 manages the waiting time of the exposure apparatus 23 so that the exposure apparatus 23 can perform the maintenance process using the waiting time in which the wafer processing apparatus 21 is switching lots, thereby achieving an improvement in the total lot-processing throughput.

Embodiment of Semiconductor Production System

An embodiment of a system for producing a semiconductor device (e.g., a semiconductor chip such as an IC or LSI, a liquid crystal panel, a CCD, a thin film magnetic head, a micromachine, etc.) is described below. This semiconductor device production system has the capability of providing, for example, maintenance service for handling a malfunction of a production apparatus installed in a semiconductor production factory, scheduling maintenance thereof, and providing software, via a computer network outside the factory.

Figure 6:
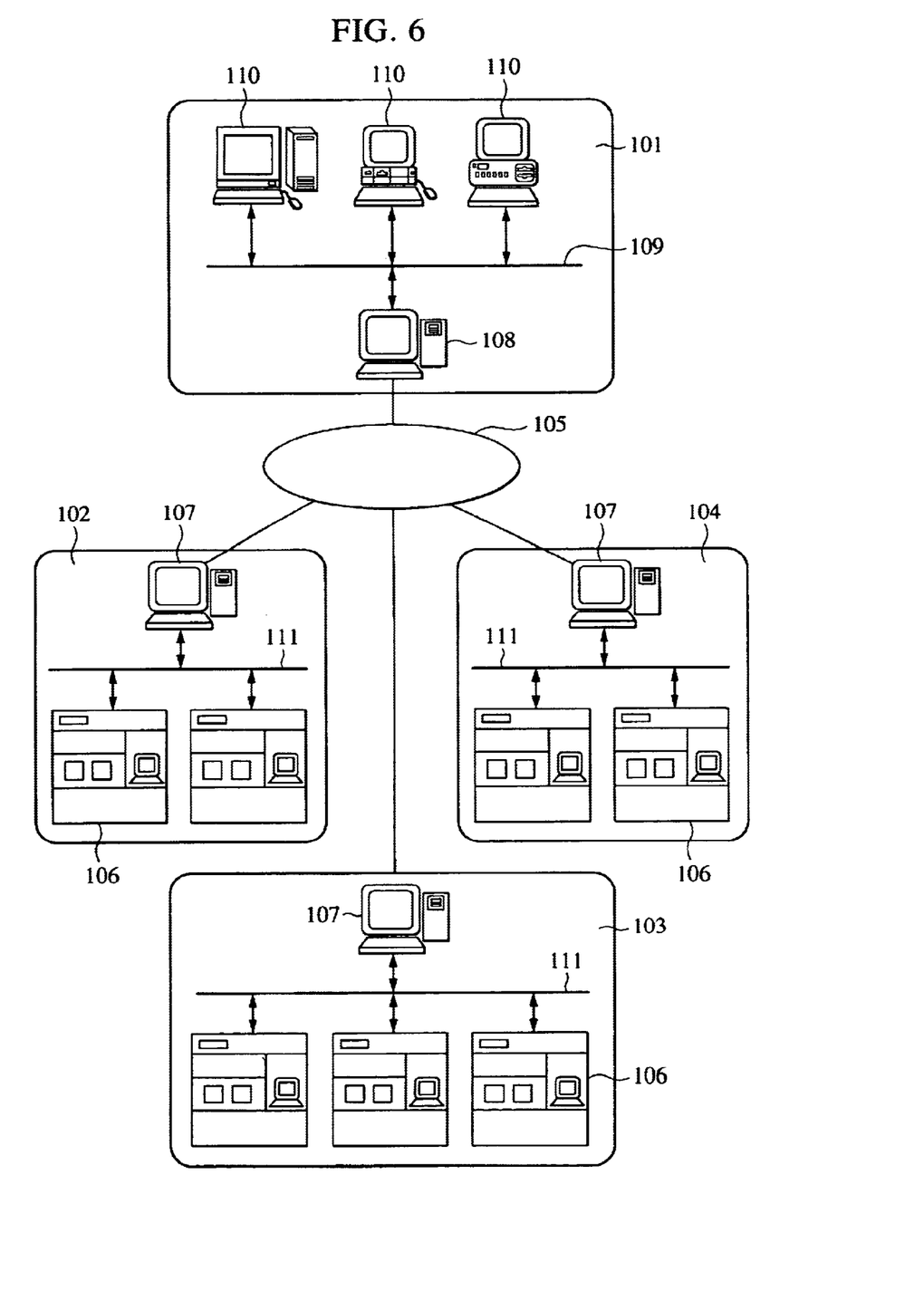
FIG. 6 is a conceptual diagram showing a semiconductor device production system as seen from one perspective.

FIG. 6 illustrates a complete production system for producing a semiconductor device, as seen from one perspective. In FIG. 6, reference numeral 101 denotes an office of a vendor (manufacturer) of semiconductor device production apparatuses. Specific examples of production apparatuses include various types of semiconductor processing apparatuses used in semiconductor production factories, such as wafer processing apparatuses (e.g., a lithography apparatus such as an exposure apparatus, a resist processing apparatus, and an etching apparatus, a heat treatment apparatus, a film deposition apparatus, a planarization apparatus), assembling apparatuses, and testing apparatuses. In the office 101, there are a host management system 108 for providing a production apparatus maintenance database, a plurality of control terminals 110, and a local area network (LAN) 109 for connecting them to provide an intranet. The host management system 108 includes a gateway for connecting the LAN 109 to an external network, such as the Internet 105, and has a security capability for limiting external access to the LAN 109.

Reference numerals 102 to 104 denote factories of semiconductor manufacturers, that is, users of production apparatuses. These factories 102 to 104 may be of different manufacturers or of the same manufacturer (for example, a first processing factory and a second processing factory of the same manufacturer). In each factory 102 to 104, there are production apparatuses 106, an intranet or a local area network (LAN) 111 for connecting the apparatuses 106 to one another, and a host management system 107 for managing and controlling the operations of the respective production apparatuses 106. Each of the host management systems 107 in the respective factories 102 to 104 has a gateway for connecting the LAN 111 of the factory with an external network, such as the Internet 105. The gateway makes it possible to access, via the Internet 105, the host management system 108 located in the vendor 101 from the LAN 111 in each factory. The security capability of the host management system 108 permits only authorized users to access the host management system 108. More specifically, it is possible to transmit status information indicating the status of the operation (for example, information representing a symptom of a problem or malfunction) of each production apparatus 106 from a factory to the vendor via the Internet 105. In response to the status information, the vendor may transmit to the factory response information (information indicating how to handle a problem or malfunction, including necessary software or data) or maintenance information such as updated software or help information. Data communication between each factory 102 to 104 and the vendor 101 and also data communication within each factory via the LAN 111 may be performed using a communication protocol known as TCP/IP, which is widely used in Internet communications. Instead of using the Internet for the external network, a dedicated network (such as an IDSN) may be used to achieve higher security to prevent access by unauthorized users. The host management system is not limited to that which is provided by the vendor. For example, a user may provide a host management system including a database accessible via an external network from a plurality of factories.

Figure 7:
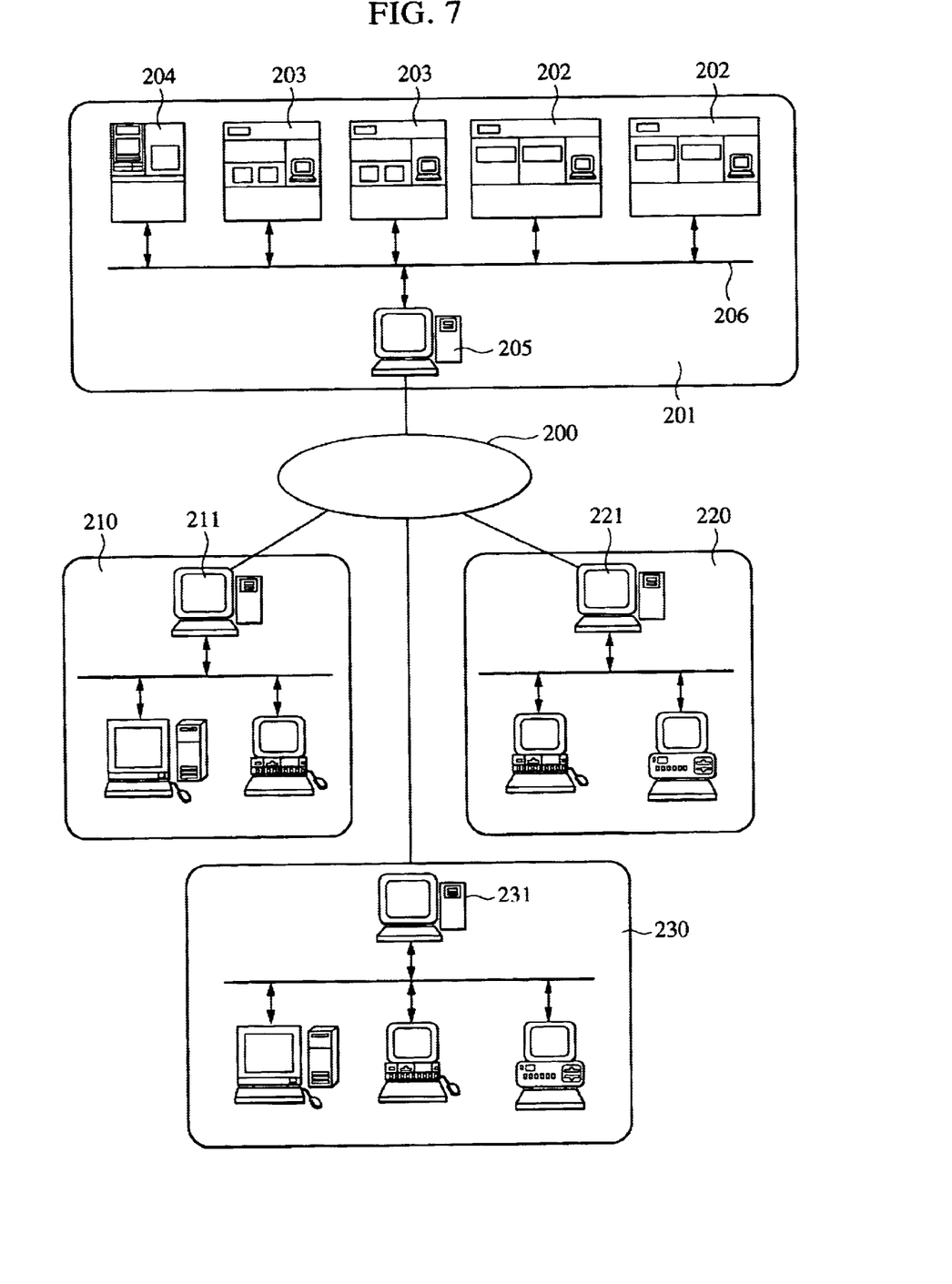
FIG. 7 is a conceptual diagram showing the semiconductor device production system as seen from another perspective.

FIG. 7 is a conceptual diagram illustrating a complete production system according to the present embodiment, as seen from a perspective different from that of FIG. 6. In the previous example, the system includes a plurality of user factories each including production apparatuses, and a vendor having a management system connected to each factory via an external network to manage production in each factory or transmit information about at least one production apparatus by means of data communication via the external network. In contrast, in the present example, the system includes a factory in which a plurality of production apparatuses provided by different vendors are installed, and the vendors of the production apparatuses have their own management systems connected to the factory via an external network so that maintenance information for the respective production apparatuses may be transmitted by means of data communication. In FIG. 7, reference numeral 201 denotes a factory (e.g., semiconductor device manufacturer), that is, a user of production apparatuses. The factory 201 has a production line in which there are various processing apparatuses for production. In this specific example, the production apparatuses in the factory include exposure apparatuses 202, a resist processing apparatus 203, and a film deposition apparatus 204. Although only one factory 201 is shown in FIG. 7, there can be a plurality of networked factories. The respective apparatuses within the factory are connected to each other via a LAN 206 so as to form an intranet. A host management system 205 manages the operation of the production line. On the other hand, host management systems 211, 221, and 231, for performing remote maintenance upon apparatuses, are disposed in respective vendors (e.g., apparatus manufacturers) such as an exposure apparatus manufacturer 210, a resist processing apparatus manufacturer 220, and a film deposition apparatus manufacturer 230. Each host management system has a maintenance database and a gateway for connection with the external network. The host management system 205 for managing the respective apparatuses in the production factory of the user is connected to the respective management systems 211, 221, and 231 of the vendors of the apparatuses via the external network 200, which can be the Internet or a dedicated external network, for example. In this system, if a problem or malfunction occurs in one of the production apparatuses in the production line, the operation of the production line stops. The production line can recover very quickly from the problem or malfunction by receiving remote maintenance from the vendor of the apparatus having the problem or malfunction via the Internet 200. Thus, it is possible to minimize the offline period of the production line.

Figure 8:
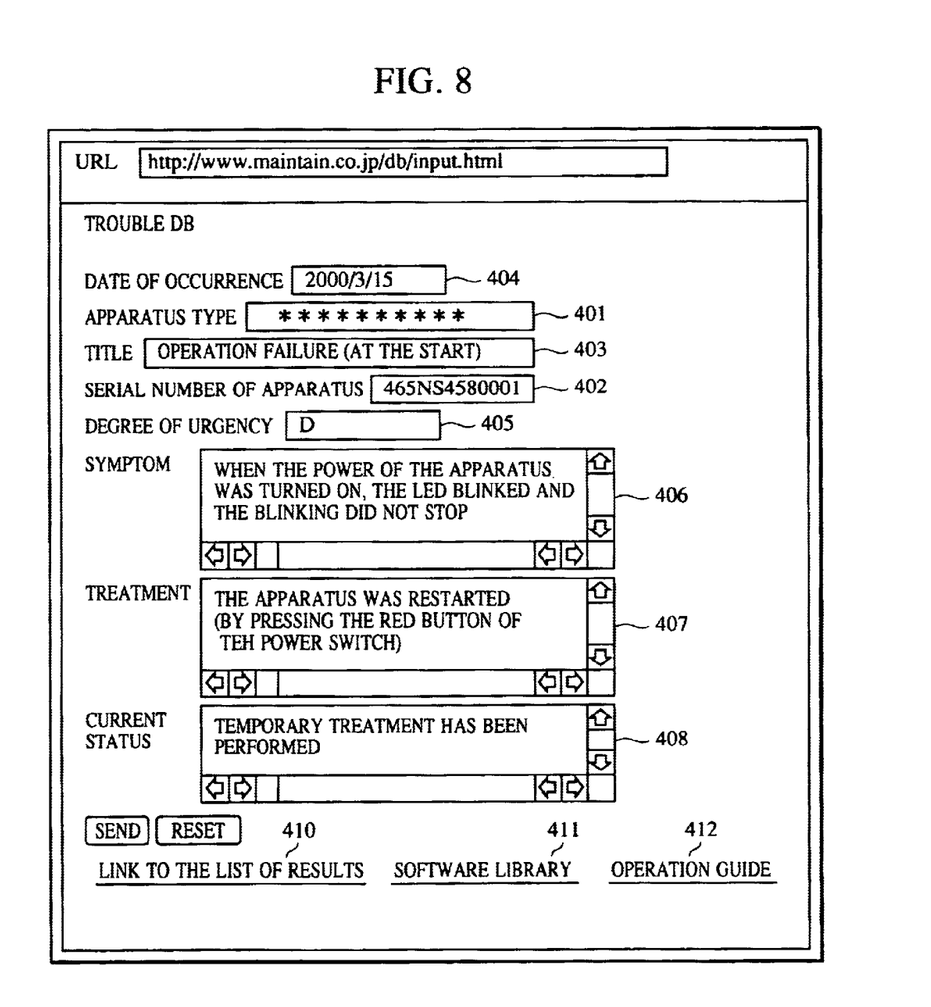
FIG. 8 is a diagram illustrating a specific example of a user interface.

Each production apparatus installed in the semiconductor factory has a display, a network interface, and a computer for executing network access software and apparatus control software stored in a storage device. Specific examples of storage devices include a built-in memory, a hard disk, and a network file server. The network accessing software includes a dedicated or general-purpose web browser which provides a user interface, such as that shown in FIG. 8, displayed on the display. A human operator who is responsible for managing an apparatus in the factory may input, via the user interface screen, information as to the type of the production apparatus (401), the serial number of the production apparatus (402), the title of the problem report (403), the date of occurrence (404), the degree of urgency (405), the symptom (406), the way to avoid the problem (407), and the action done (408). The input information is transmitted to the maintenance database via the Internet. In response, maintenance information is returned from the maintenance database and displayed on the display. The web browser user interface may include hyperlinks (410 to 412), as shown in FIG. 8, for allowing the operator to obtain further detailed information of a particular item from the maintenance database, download the latest version of software to a production apparatus from a software library provided by a vendor, and read an operation guide (e.g., help information) for an apparatus. The maintenance information provided by the maintenance database may include sample information indicating the times needed for the above-described processes according to the present invention. Furthermore, the software library may include software according to the present invention, such as that shown in FIG. 5.

Figure 9:
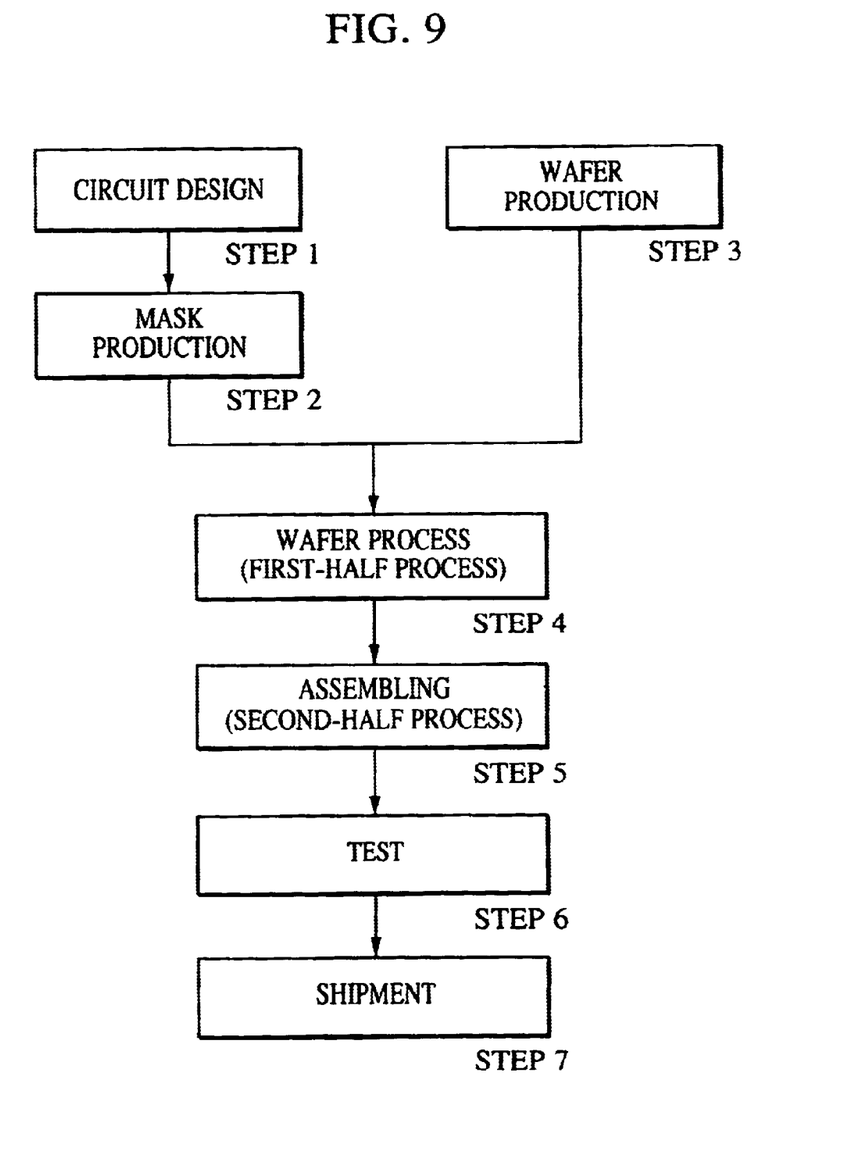
FIG. 9 is a flow chart of a device production process.

A process of producing a semiconductor device using the above-described production system is described below. FIG. 9 is a flow chart of an overall device production process. In step 1 (circuit design), a semiconductor device circuit is designed. In step 2 (mask production), masks having patterns designed in step 1 are produced. In step 3 (wafer production), a wafer is produced using silicon or the like. In step 4 (wafer process, or often called a first half process or a pre-process), an actual circuit is formed on the wafer by means of a lithography technique using the masks and the wafer produced in the previous steps. In step 5 (assembly, or often called a second half process or a post-process), the wafer produced in step 4 is divided into chips. This step includes substeps of assembly (dicing and bonding) and packaging (chip encapsulation). In step 6 (test), the semiconductor devices produced in the previous steps are tested to confirm that they operate correctly. The reliability of the devices are also evaluated in step 6. The satisfactory semiconductor devices then are shipped in step 7. The wafer process and the assembling process are performed in different factories, and the production apparatuses in each factory are maintained by the remote maintenance system described above. Furthermore, information necessary for production management and maintenance of apparatuses is transmitted by means of data communication between the wafer process factory and the assembling factory via the Internet or a dedicated network.

Figure 10:
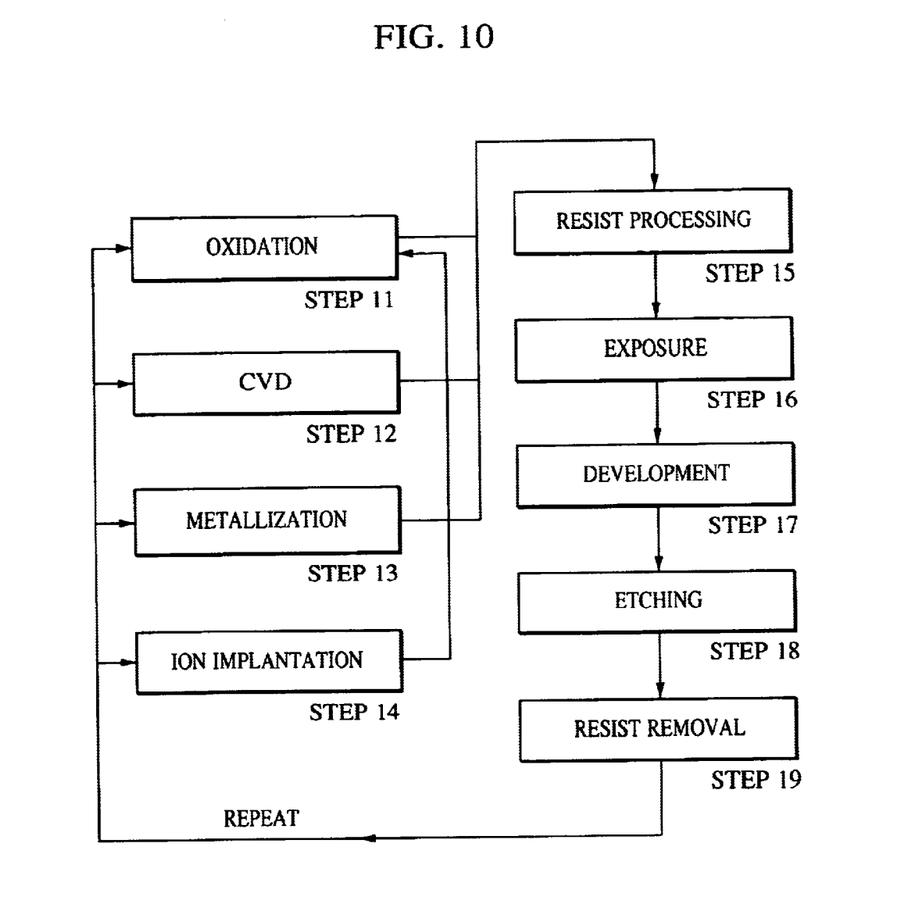
FIG. 10 is a flow chart of a wafer process.

FIG. 10 is a flowchart illustrating the details of the wafer process. In step 11 (oxidation), the surface of the wafer is oxidized. In step 12 (CVD), an insulating film is formed on the surface of the wafer. In step 13 (metalization), electrodes are formed on the surface of the wafer by means of evaporation. In step 14 (ion implantation), ions are implanted into the wafer. In step 15 (resist processing), a photosensitive material is coated on the wafer. In step 16 (exposure), a latent image of a circuit pattern formed on a mask is formed in the resist using the semiconductor exposure apparatus described above. In step 17 (development), the wafer is developed. In step 18 (etching), the surface of the wafer is partially removed except for the portions covered by the resist pattern developed in the previous step. In step 19 (resist removal), the resist, which has become no longer necessary after the etching process, is removed. The above process is performed repeatedly, thereby forming a multi-level circuit pattern on the wafer. Because the production apparatuses in each factory are maintained by the remote maintenance system described above, problems with the production apparatuses can be prevented. Even if a problem occurs in an apparatus, it is possible to quickly recover from the problem. Thus, it is possible to improve the productivity of the semiconductor device production process.

In the present invention, as described above, the exposure system includes the exposure apparatus and the wafer processing apparatus including the resist coater and the developing apparatus, which are all connected to the host computer, and the exposure apparatus performs the calibration process using the waiting time, thereby achieving an improvement in the total throughput in the semiconductor device production.

Except as otherwise discussed herein, the various components shown in outline or in block form in the Figures are individually well known and their internal construction and operation are not critical to the making or using or to a description of the best mode of the invention.

While the present invention has been described with reference to what are currently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A system for performing an exposure process on a wafer comprising:
    an exposure apparatus which performs an exposure process on the wafer on which a pre-exposure process has been performed by a wafer processing apparatus other than said exposure apparatus, and executes a calibration process on said exposure apparatus; and
    a computer which issues a command to said exposure apparatus to execute the calibration process, based on a first time required for the wafer processing apparatus to perform the pre-exposure process on the wafer and a second time required for said exposure apparatus to execute the calibration process.

2. A system according to claim 1, further comprising said wafer processing apparatus.

3. A system according to claim 1, wherein said computer issues the command if the first time is longer than the second time.

4. A system according to claim 1, further comprising a storage unit which stores data of the first time.

5. A system according to claim 1, further comprising a storage unit which stores data of the second time.

6. A system according to claim 1, wherein the calibration process includes at least one of a baseline calibration process, and a stage reference point calibration process.

7. A system according to claim 1, wherein said system includes a plurality of said exposure apparatuses.

8. A system according to claim 2, wherein said system includes a plurality of said wafer processing apparatuses.

9. A system according to claim 1, wherein the wafer processing apparatus is one of a coater, a cold plate, a hot plate, a wafer hand and a developer.

10. A system according to claim 1, wherein said computer issues the command to said exposure apparatus to execute a selected part of the calibration process based on the first time and the second time.

11. A system according to claim 1, wherein said exposure apparatus and said computer are connected via a network.

12. A system according to claim 1, wherein said exposure apparatus and said wafer processing apparatus are connected via a network.

13. A system for performing an exposure process on a wafer, comprising:
    a pre-exposure unit which performs a pre-exposure process on a wafer;
    an exposure unit which performs an exposure process on the wafer on which the pre-exposure process has been performed by said pre-exposure unit, and executes a calibration process on the exposure unit; and a computer which issues a command to said exposure unit to execute the calibration process, based on a first time required for said pre-exposure unit to perform the pre-exposure process on the wafer and a second time required for said exposure unit to execute the calibration process.

* * * * *

UNITED STATES PATENT AND TRADEMARK OFFICE
CERTIFICATE OF CORRECTION

PATENT NO. : 6,889,014 B2
DATED : May 3, 2005
INVENTOR(S) : Shin Takano

It is certified that error appears in the above-identified patent and that said Letters Patent is hereby corrected as shown below:

Title page,
Item [56], References Cited, U.S. PATENT DOCUMENTS,
"6,493,065 B2 *   12/2002   Ina        355/53" should read
-- 6,493,065 B2 *   12/2002   Ina et al.   355/53 --.

Column 3,
Line 39, the first occurrence of "apparatus" should read -- apparatus, --.

Column 12,
Line 58, "claim 1," should read -- claim 2, --.

Signed and Sealed this

Twenty-fifth Day of October, 2005

JON W. DUDAS
*Director of the United States Patent and Trademark Office*